US006304202B1

(12) United States Patent
Pastorello et al.

(10) Patent No.: US 6,304,202 B1
(45) Date of Patent: Oct. 16, 2001

(54) DELAY CORRECTION SYSTEM AND METHOD FOR A VOLTAGE CHANNEL IN A SAMPLED DATA MEASUREMENT SYSTEM

(75) Inventors: Douglas F. Pastorello, Hudson; Eric T. King, Temple, both of NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/484,866

(22) Filed: Jan. 18, 2000

Related U.S. Application Data

(63) Continuation-in-part of application No. 09/405,370, filed on Sep. 24, 1999.

(51) Int. Cl.[7] .............................. H03M 1/00; G01R 11/20

(52) U.S. Cl. .......................... 341/155; 341/143; 324/142; 324/622; 702/89

(58) Field of Search ..................................... 324/621, 622, 324/625, 140 R, 141, 142; 702/61, 89, 106, 291; 341/143

(56) References Cited

U.S. PATENT DOCUMENTS 4,463,311 * 7/1984 Kobayashi ........................... 324/142
5,124,656 * 6/1992 Yassa et al. .......................... 328/155
5,485,393 * 1/1996 Bradford ................................ 702/60
5,764,523 * 6/1998 Yoshinaga et al. .................... 702/61
5,963,074 * 10/1999 Arkin ................................... 327/276
6,166,573 * 12/2000 Moore et al. ........................ 327/161

* cited by examiner

*Primary Examiner*—Howard L. Williams
(74) *Attorney, Agent, or Firm*—Stanley N. Protigal; Steven Lin

(57) ABSTRACT

Delay correction in a dual-channel analog-to-digital converter (ADC) is accomplished by insertion of coarse and fine delay correction registers prior to and after a frequency reduction element in a voltage channel. A dual-channel ADC includes first and second delta-sigma modulators and a digital filter, subject to multiple sampling rates for optimizing coarse and fine adjustments of delay. An energy calculation is performed in a sampled data domain, which is implemented using digital multiplication techniques in a delay compensation scheme performed in the digital domain. The digital data subject to filter processing is delayed by predetermined amounts. The dual-channel ADC is provided with a programmable channel delay adjustment in the voltage channel thereof. A delay differential equal to ΔI−ΔV is calibrated and compensated subject to an acceptable time delay for production of a correct energy value. The ADC according to the present invention further oversamples received analog signal at clock rates much higher than the output rate of the ADC, and delays are generated in the downstream filters connected to the ADCs.

56 Claims, 9 Drawing Sheets

DELAY CORRECTION SYSTEM AND METHOD FOR A VOLTAGE CHANNEL IN A SAMPLED DATA MEASUREMENT SYSTEM

CROSS REFERENCE TO RELATED APPLICATIONS

This application is a continuation-in-part application of U.S. patent application Ser. No. 09/405,370 entitled "Energy-to-Pulse Converter with Output Frequency Greater than the Calculation Frequency and Output Phasing" having inventors Doug Pastorello and Eric T. King, and having been filed on Sep. 24, 1999; and is related to U.S. patent application Ser. No. 09/484,480, entitled "DIGITAL PHASE COMPENSATION METHODS AND SYSTEMS FOR A DUAL-CHANNEL ANALOG-TO-DIGITAL CONVERTER" having inventors Eric T. King and Doug Pastorello; each of these applications filed on even date herewith, and each incorporated herein by reference in its entirety.

BACKGROUND OF THE INVENTION

1. Field of the Invention

The invention generally relates to analog-to-digital converters and more particularly to phase equalization in a dual-channel analog-to-digital converter used in a power meter.

2. Description of the Related Art

Energy calculations for electric power loads are made by power meters of all kinds. Until recently, electromechanical power meters were exclusively employed in millions of homes and businesses worldwide to monitor the amount of power consumption by a user at a particular location. Such monitoring allows the electricity/power entities to monitor the power (energy) usage of the user for proper billing, load monitoring, servicing, etc. In electromechanical power meters, a series of electrical components as well as mechanical disks, gears, indicators, and dials are used to convert voltage and current into energy. In addition to low accuracy, these electromechanical power meters also require periodic manual calibration and check-ups by field service technicians to ensure that they are operating properly. Digital meters have recently begun to replace electromechanical meters in monitoring power consumption for homes and businesses. In general, because they rely on digital rather than electromechanical components, digital meters are more accurate and reliable than their counterpart electromechanical meters. Additionally, through networking, digital meters allow calibration and monitoring check-ups to be performed from a remote location such as a central office, thereby greatly reducing the on-site visits by field service technicians. Finally, due to deregulation of the electricity market in the United States and Europe, a broader range of information on consumer power use is needed by competing power suppliers for customizing the billing and servicing plan for each consumer. Due to these advantages, in the near future, digital meters will likely replace all of the 60 million electromechanical power meters that are in use today in industrial and residential applications. In general, electronic (digital) power meters use sensors such as transformers, for example, to measure the analog current and voltage from the power lines. These measurements are converted into digital words using analog-to-digital converters (ADCs). A power value P is then computed using the converted digital current words and the converted digital voltage words, according to the equation P=V*I wherein V represents voltage and I represents current. However, the measurement process and conversion process may introduce delays into signals carrying the digital voltage words and digital current words, which can cause the signals to be out of phase relative to each other. One technique to equalize the phase change involves compensating the sensors. This, however, may be expensive because it requires making physical adjustments to passive devices. Another technique to equalize the phase change involves scaling the power output value by a predetermined scaling factor after it has been computed. This technique is based upon the power equation P=I*V*cos $\phi$ that relates voltage V, current I, and the phase error $\phi$ between I and V. According to this technique, the power value P is divided by the factor cos $\phi$ to compensate for the phase error between I and V. This requires prior knowledge of the phase error $\phi$. However, the error angle $\phi$ is a function of frequency which may drift over time, thereby making the scaling factor cos $\phi$ variable. As such, the power value computed using a fixed scaling factor cos $\phi$ may thus be inaccurate. In addition, an actual phase angle $\phi_A$ between the current and voltage may exist as the load becomes less resistive. This also will produce an error in the computed power value.

The energy consumed by a particular electric power load can be calculated according to the following formulas:

$$E = \int_{ti}^{tf} P(t)\,dt$$

and $$E = \int_{ti}^{tf} I(t)V(t)\,dt$$

The energy calculation can be carried out in a sampled data domain, permitting digital multiplication. The measurement system including sensors and analog-to-digital converters (ADCs), contributes different delays to the voltage and current channels. The error results in a difference in calculated watt-hours between watt-hours calculated with and without delays. In the past, the sample clock for the ADCs has been shifted, making necessary the design of a complex clock generator, not only for the ADCs but for any filters in the signal paths. For example, see Coln, et al., U.S. Pat. No. 5,017,860.

SUMMARY OF THE INVENTION

According to the present invention, filter correction in a dual-channel analog-to-digital converter (ADC) is accomplished by delaying conversion results in fixed length registers. According to one embodiment of the present invention, a dual-channel ADC includes first and second delta-sigma modulators and digital filters, subject to multiple sampling rates suitable for optimizing coarse and fine adjustments of delay. Further according to the present invention, an energy calculation is performed in a sampled data domain, which is implemented using digital multiplication techniques. In particular according to the present invention, the digital data subject to filter processing is delayed by predetermined amounts. According to the present invention there is further no need to shift the sample clock of the ADCs, which would require a complex clock generator not only for the ADC components but for any filters in the signal paths of interest. Further, according to the present invention, a differential delay is compensated subject to an acceptable time delay for production of a correct energy value. The ADC according to the present invention further oversamples received analog signal at clock rates much higher than the output rate of the ADC, and delays are generated in the downstream filters connected to the ADCs. Thus according to the present invention, the analog signals are left alone and not adjusted. Instead, the data which comes out of the analog circuitry is treated as normal, and delay circuitry is connected between the filter circuitry according to the present embodiment.

DETAILED DESCRIPTION OF THE INVENTION

Figure 1A:
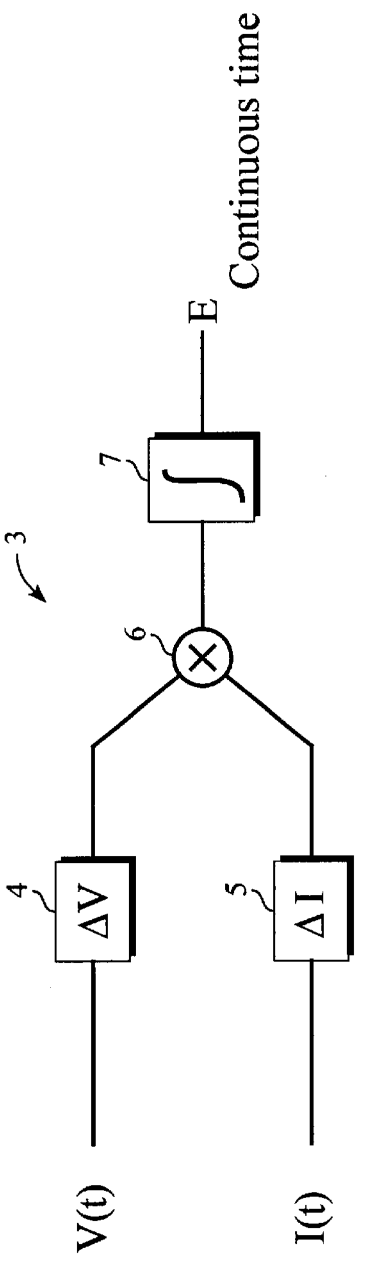
FIG. 1A is a diagram of a continuous time measurement system according to the present invention, including sensors and ADCs, in which the measurement system contributes delays of ΔV and ΔI to the voltage and current channels.

Referring now to FIG. 1A, there is shown a block diagram of a continuous time measurement system 3 with lumped delay to represent delays in sensors and ADCs, shown as ΔV and ΔI in the voltage and current channels. In particular, the continuous time measurement system 3 includes a voltage channel delay 4, a current channel delay 5, a multiplication node 6, and an integrator 7. The multiplication node 6 is connected to the outputs of the voltage and current blocks 4 and 5. The integrator 7 is connected to the output of the multiplication node 6. The integrator 7 produces an output energy (E) signal value.

Figure 1B:
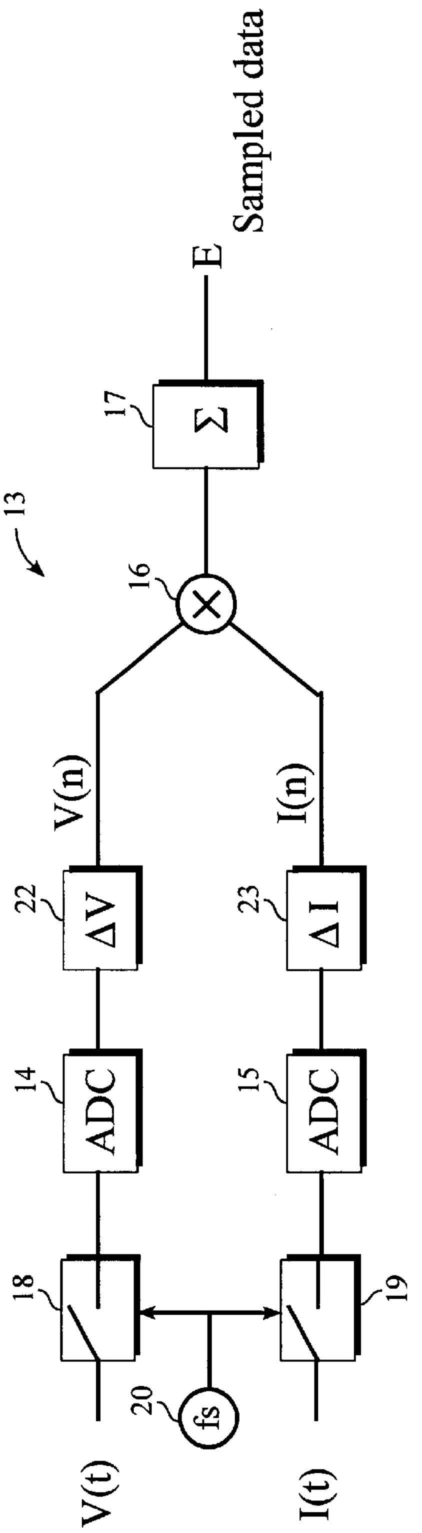
FIG. 1B is a diagram of a sampled data measurement system according to the present invention, including sensors and ADCs, in which the measurement system contributes delays of ΔV and ΔI to the voltage and current channels.

Referring now to FIG. 1B, there is shown a diagram of a sampled data measurement system 13 according to the present invention, with an analog-to-digital converters 14, 15, a multiplication node 16, and a summation block 17. Also shown are a voltage channel delay 14, first and second sampling switches respectively 18 and 19, a sample frequency source 20 connected to said first and second sampling switches 18, 19, a current channel delay 15, a multiplication node 16, and a summation block 17. The analog-to-digital converters 14, 15 are connected to respective ones of the first and second sampling switches 18, 19 and a pair of equivalent filter delays 22, 23 are connected to the analog-to-digital converters 14, 15. The analog-to-digital converters 14, 15 are responsive to EMF (voltage) and current, respectively, and the equivalent filter delays 18, 19 provide delays for EMF and voltage, respectively. The equivalent filter delays 18, 19, receive the signals from the analog-to-digital converters 14, 15 and provide filtered outputs to the multiplication node 16.

Figure 2A:
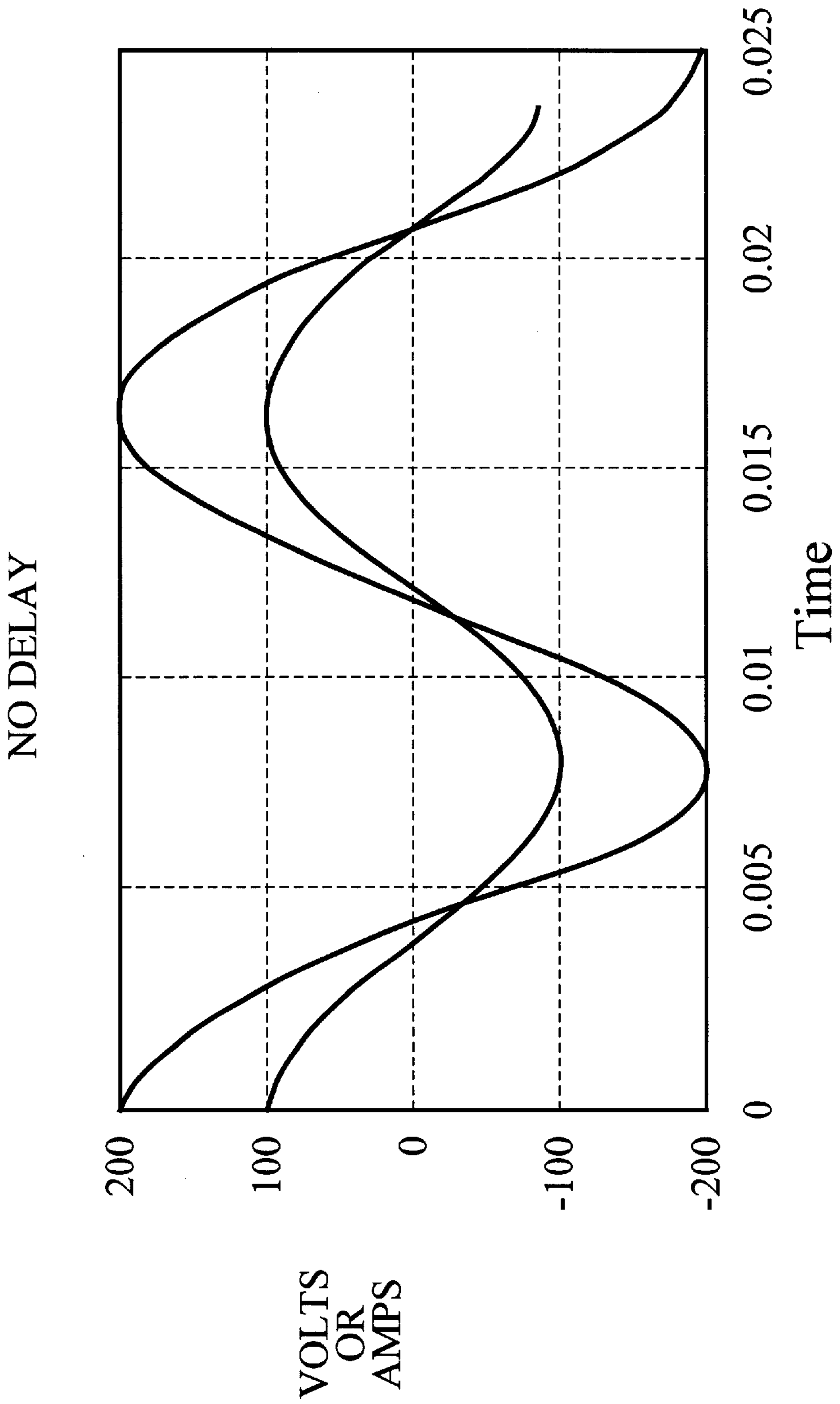
FIGS. 2A through 2F are diagrams of waveforms showing the errors in calculations resulting from delays of ΔV and ΔI in the voltage and current channels of the ADC system.
Figure 2B:
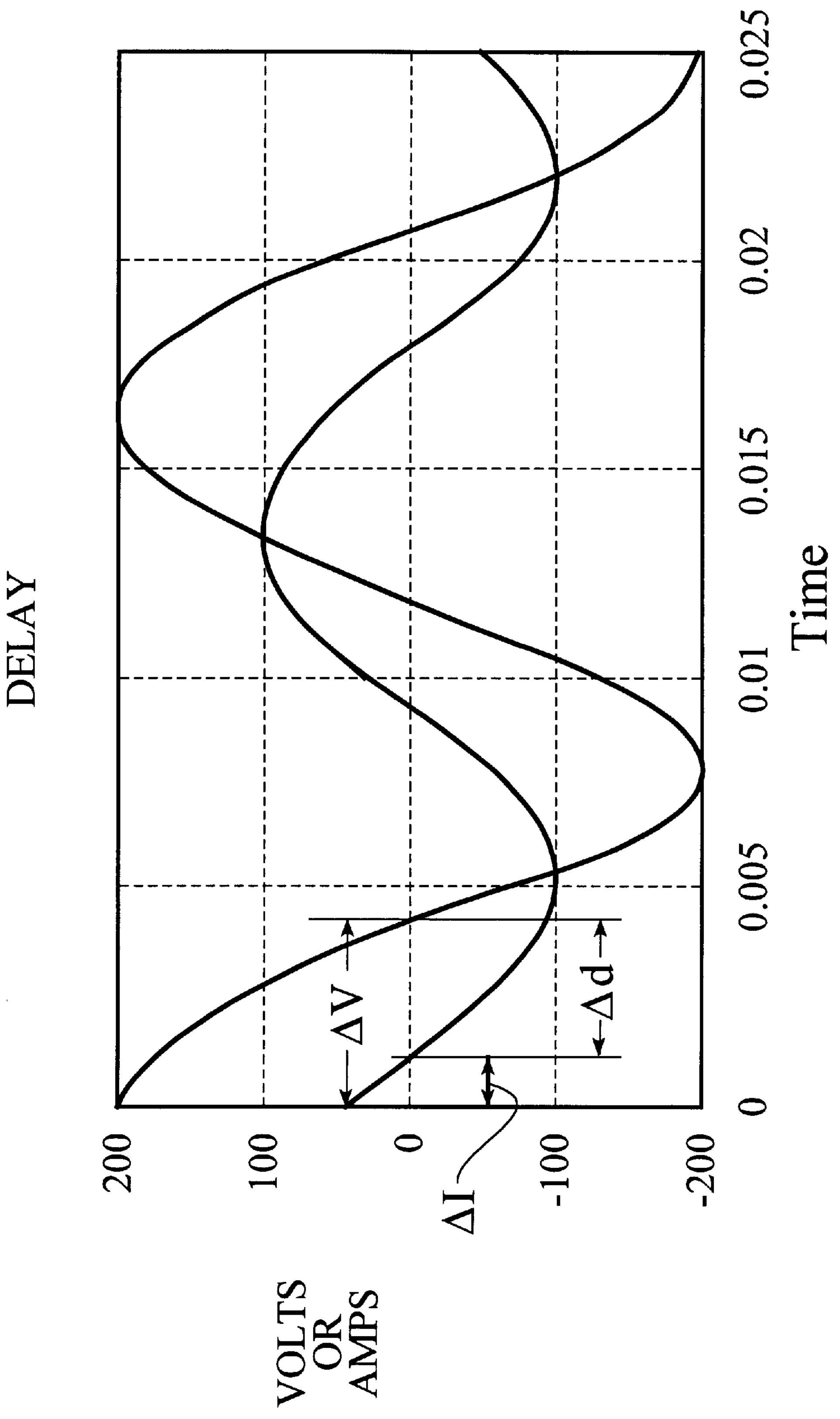
Figure 2C:
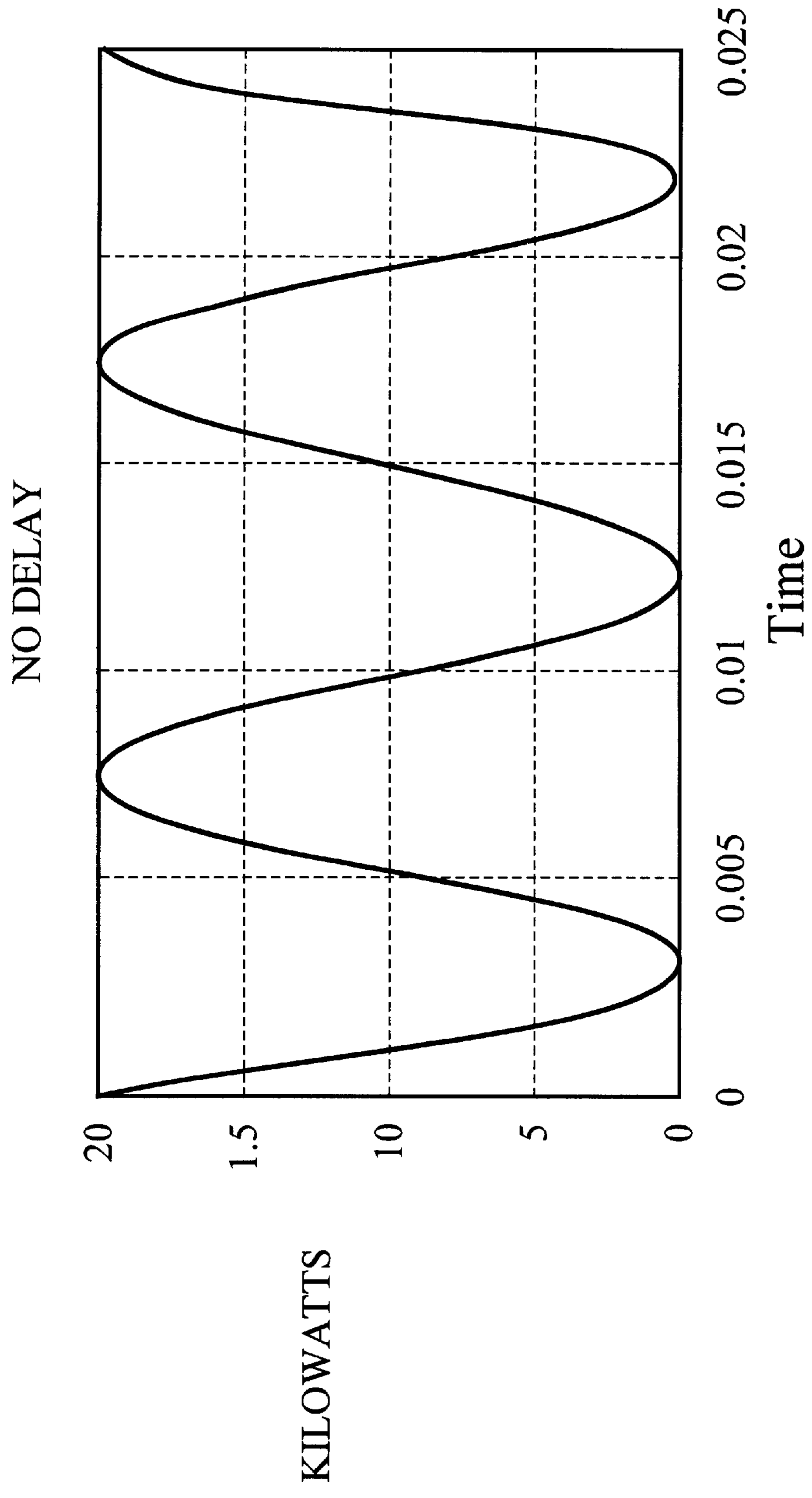
Figure 2D:
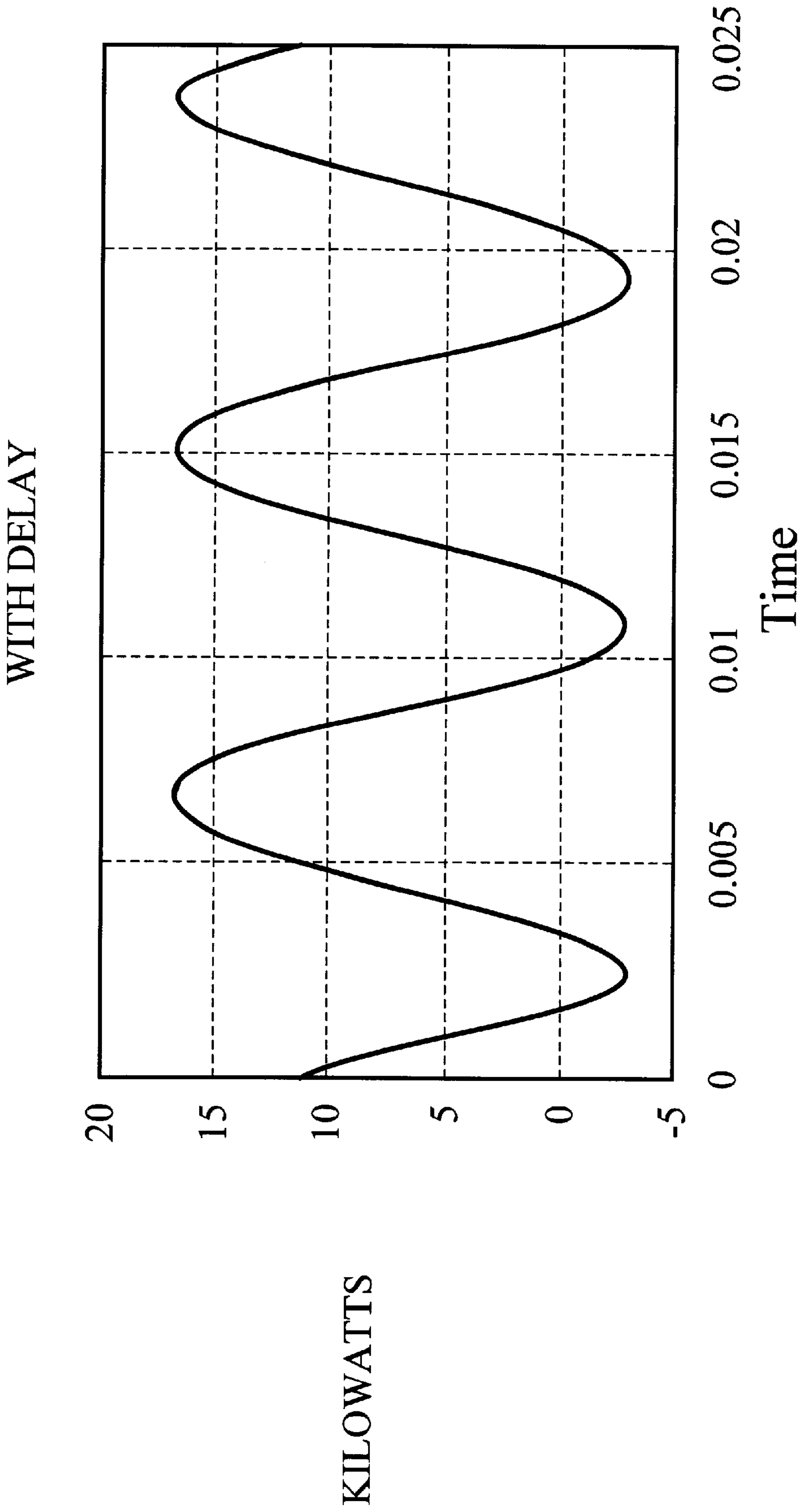
Figure 2E:
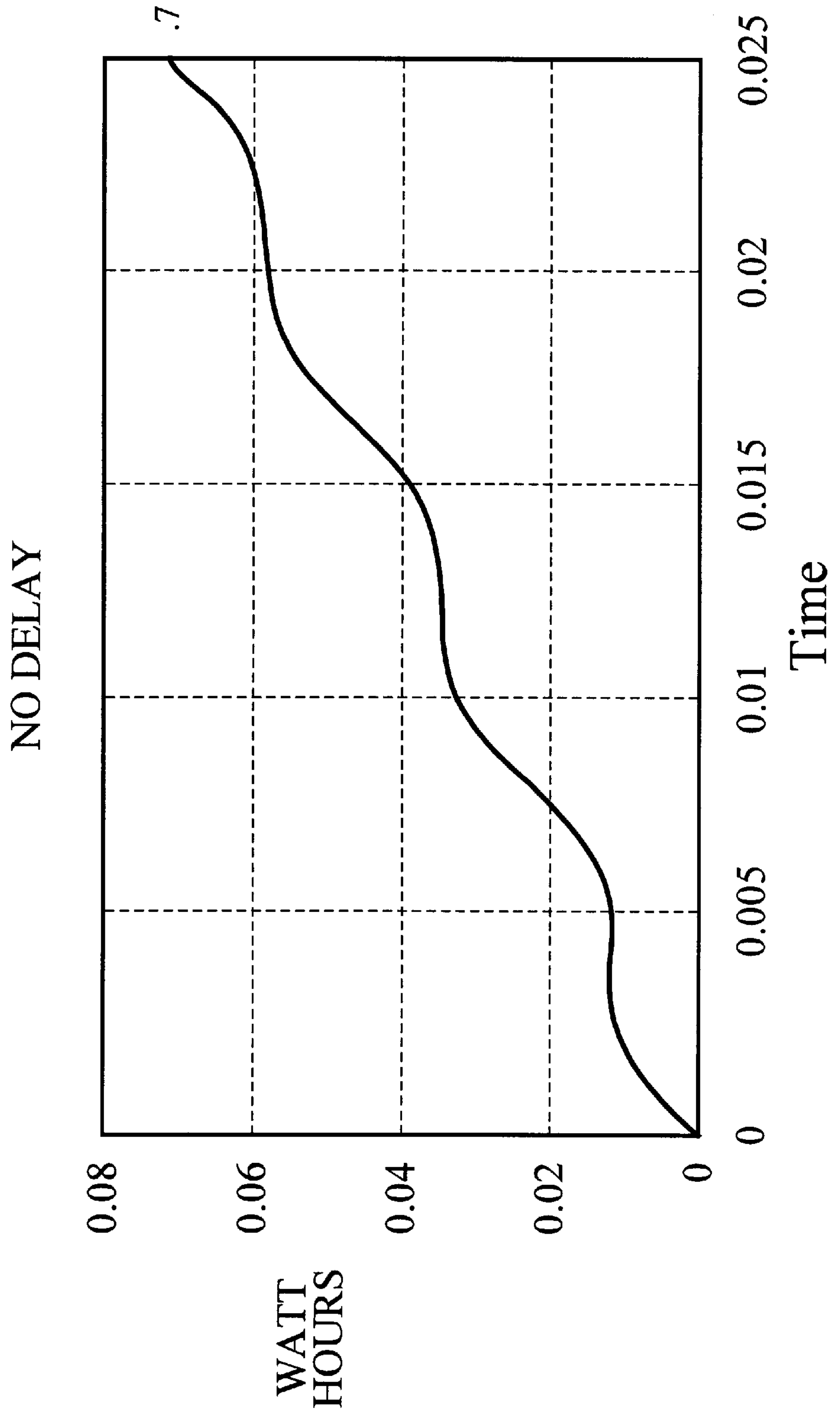
Figure 2F:
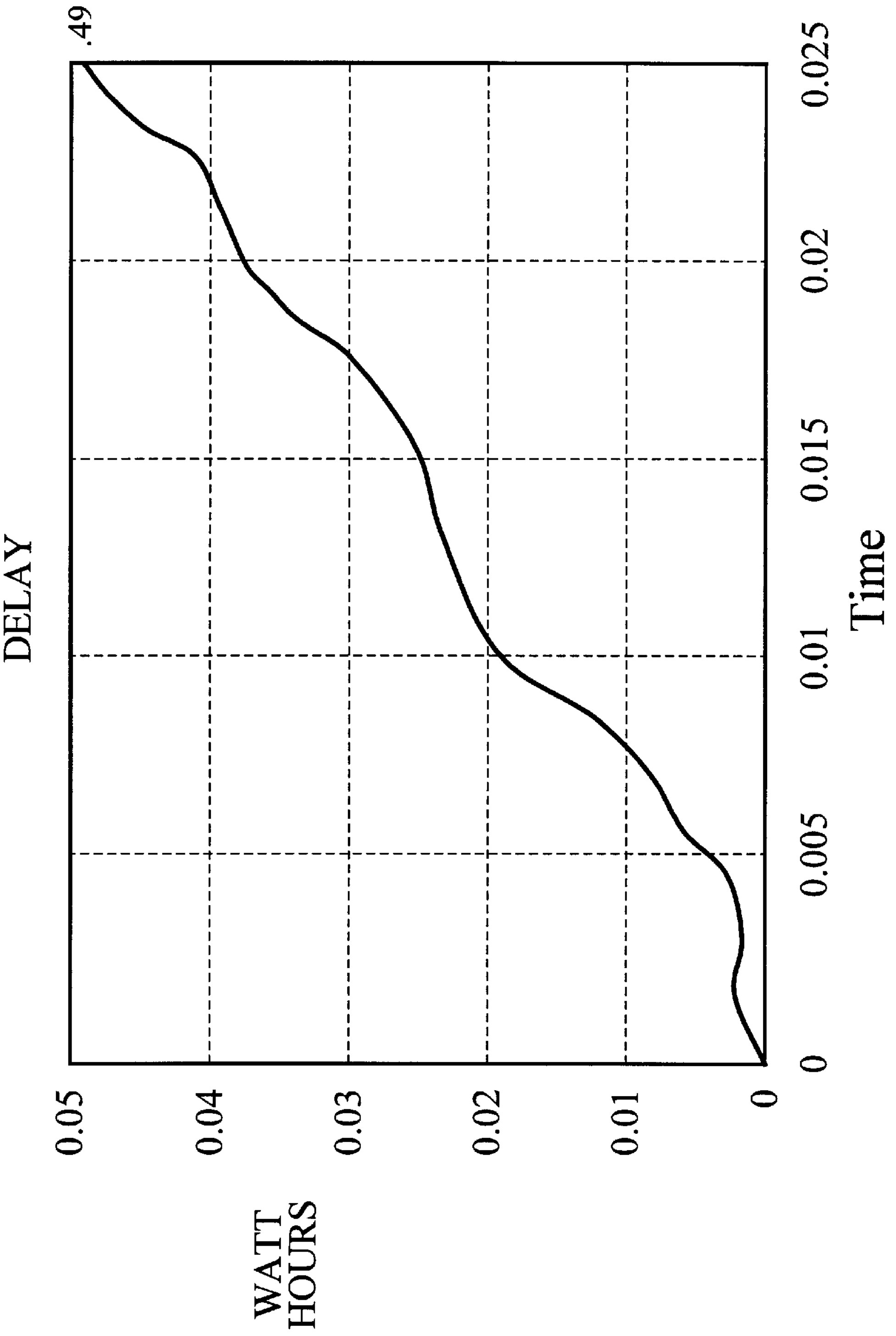

Referring now to FIGS. 2A through 2F are diagrams of waveforms showing the errors in energy calculations resulting from delays of ΔV and ΔI in the voltage and current channels of the ADC. In particular, FIG. 2A is a diagram of an undelayed voltage and current signal according to a sinusoidal format. FIG. 2B are delayed current and voltage signals according to the format of the undelayed sinusoidal indicated in FIG. 2A. FIGS. 2C and 2D are corresponding undelayed and delayed power curves. Finally, FIGS. 2E and 2F are corresponding undelayed and delayed energy curves.

Figure 3:
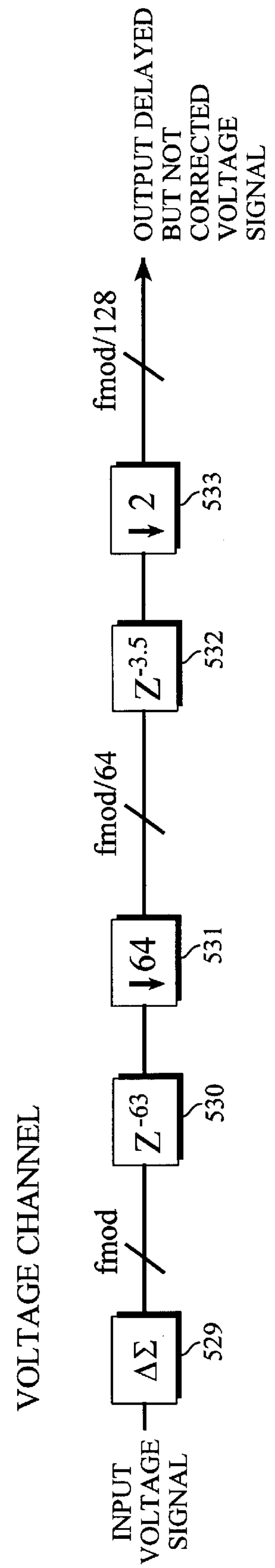
FIG. 3 is an uncorrected voltage channel in an ADC converter system.

Referring now to FIG. 3, there is shown a voltage channel 528 which provides particular filter induced delays. In particular, the Figure shows a delayed voltage channel 528 including a delta sigma analog-to-digital converter 529, a first filter delay element 530, a first decimator 531, a second filter delay element 532, and a second decimator 533. The voltage channel 528 receives an input voltage signal at the delta sigma analog-to-digital converter 529 which is connected to the first filter delay element 530. The first filter delay element 530 is in turn connected to the first decimator 531 which is then connected to the second filter delay element 532. Finally, the second filter delay element 532 is connected to the second decimator 533 to produce an output fmod/128 signal. The Figure shows the total channel delay without phase compensation. The delta sigma analog-to-digital converter 529 converts analog signals received at a first modulation frequency fmod. Immediately after conversion by the delta sigma analog-to-digital converter 529, the channel frequency is stepped down by a factor of 64 by decimator 531. Thus, the channel frequency after decimator 531 is fmod/64. Further, the frequency is stepped down by the factor of 2, resulting in a voltage channel frequency of fmod/128. The total delay for the voltage channel can be calculated at $\Delta V_F$=63+3.5*64 =287/fmod seconds, where fmod is the modulator output frequency 512 kHz for example.

Figure 4:
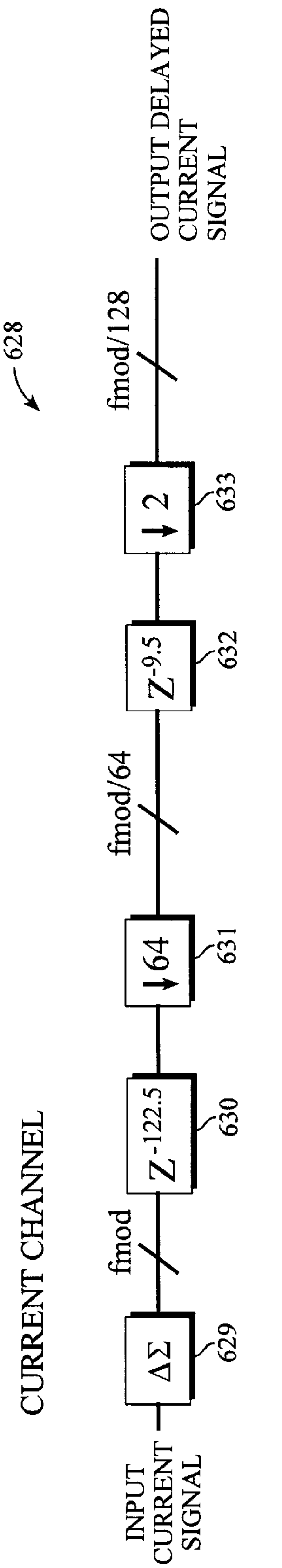
FIG. 4 is an uncorrected current channel in an ADC converter system.

Referring now to FIG. 4, there is shown a delayed current channel 628 according to the prior art. The delayed current channel 628 includes a delta sigma analog-to-digital converter 629, a first filter delay element 630, a first decimator 631, a second filter delay element 632, and a second decimator 633. The current channel 628 receives an input voltage signal at the delta sigma analog-to-digital converter 629 which is connected to the first filter delay element 630. The first filter delay element 630 is in turn connected to the first decimator 631 which is then connected to the second filter delay element 632. Finally, the second filter delay element 632 is connected to the second decimator 633 to produce an output fmod/128 signal. The Figure shows the total channel delay without filter correction. The delta sigma analog-to-digital converter 529 converts analog signals received at a first modulation frequency fmod. Immediately after conversion by the delta sigma analog-to-digital converter 629, the channel frequency is stepped down by a factor of 64 by decimator 631. Thus, the channel frequency after decimator 631 is fmod/64. Further, the frequency is stepped down by the factor of 2, resulting in a current channel frequency of fmod/128. The total delay for the current channel can be calculated at $\Delta I_F$=122.5+9.5*64=730.5/fmod seconds, where fmod is the modulator output frequency 512 kHz for example.

Figure 5:
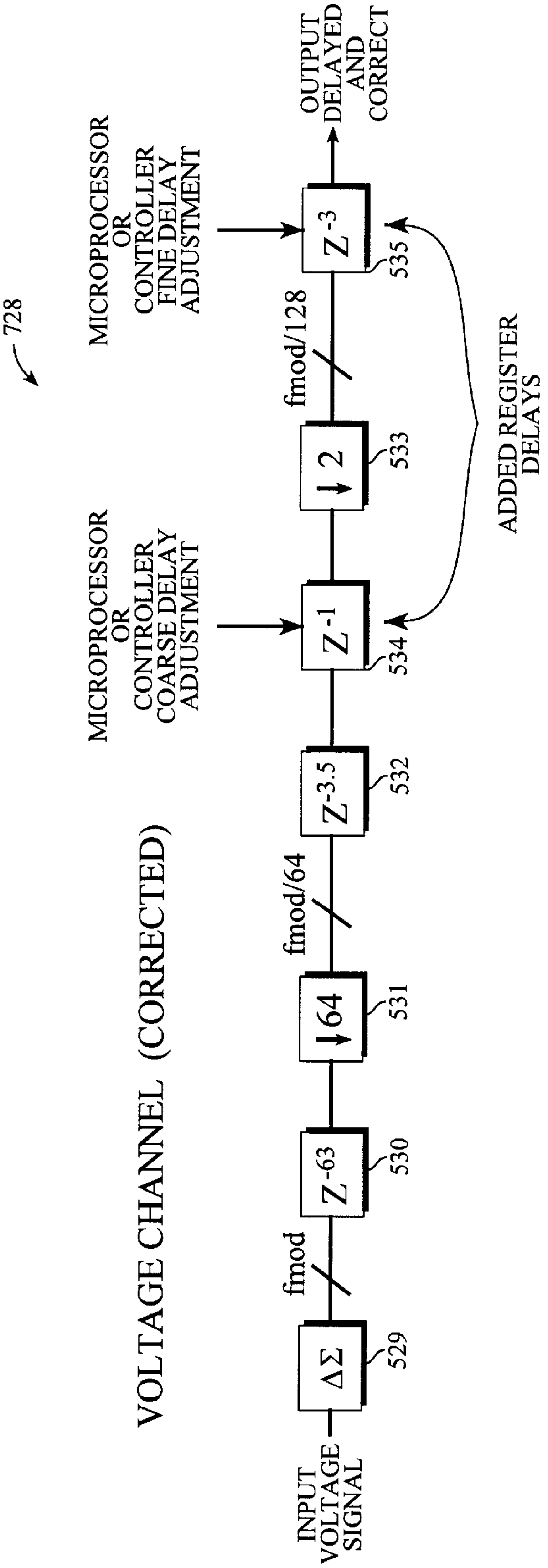
FIG. 5 is a corrected voltage channel in an ADC converter system having first through third clock speeds, according to the present invention.

Referring now to FIG. 5, there is shown a corrected voltage channel 728 according to the present invention. In particular, the Figure shows the corrected voltage channel 728 in an ADC converter system having first through third clock speeds (e.g., HICLK, MDCLK, and LOCLK), according to one embodiment of the present invention. Moreover, the delayed voltage channel 728 includes a delta sigma analog-to-digital converter 529, a first filter delay element 530, a decimator 531, a second filter delay element 532, a first register delay element 534, a second decimator 533, and a second register delay element 535. The voltage channel 528 receives an input voltage signal at the delta sigma analog-to-digital converter 529 which is connected to the first filter delay element 530. The first filter delay element 530 is in turn connected to the first decimator 531 which is then connected to the second filter delay element 532. Finally, the second filter delay element 532 is connected to the first register delay element 534, and the first register delay element 534 is then in turn connected to the second decimator 533 which produces an fmod/128 signal. The second decimator 533 is then connected to the second register delay element 535 to produce a delayed fmod/128 output signal. The Figure shows the total channel delay with filter correction. The first register delay element 534 provides a coarse delay adjustment, which can be provided by a controller or a microprocessor according to one embodiment of the present invention. The second register delay element 535 provides a fine delay adjustment, which can be provided by a controller or a microprocessor according to one embodiment of the present invention. To compensate at a desired delay amount, only one path (i.e., the voltage path) needs to be subject to compensation. The voltage channel is selected for compensation, as its resolution is not as great at the current channel, therefore requiring less silicon area for fabrication of delay registers. Moreover, programmable delay registers are added in two places according to one embodiment of the present invention—one at a relatively high frequency and one at a relatively lower frequency region of the voltage channel. The clock rate for these delay registers is set at successively reduced levels, according to one embodiment of the present invention. The delta sigma analog-to-digital converter 529 converts analog signals received at a first modulation frequency fmod. Immediately after conversion by the delta sigma analog-to-digital converter 529, the channel frequency is stepped down by a factor of 64 by decimator 531. Thus, the channel frequency after decimator 531 is fmod/64. At this frequency, a coarse delay adjustment is made according to the setting provided by first delay adjustment register 534. According to one embodiment, the delay adjustment is made by a microprocessor or controller setting the value of the first delay adjustment register 534. Further, the frequency is stepped down by the factor of 2, resulting in a current channel frequency of fmod/128. At this frequency, a fine delay adjustment is made according to the setting provided by second delay adjustment register 535. According to one embodiment, the delay adjustment is made by a microprocessor or controller setting the value of the second delay adjustment register 535. The total delay for the compensated voltage channel can be calculated at $\Delta V_F$=63 +4.5*64+3*128=735/fmod seconds, where fmod is the modulator output frequency 512 kHz for example. The total delay for the uncompensated and uncorrected current channel continues to be calculable at $\Delta I_F$=: 122.5+9.5*64=730.5/fmod seconds, where fmod is the modulator output frequency 512 kHz for example. The respective voltage and current channel delays, although not exactly the same, are sufficient to be workable according to the present invention.

While the invention has been particularly shown and described with reference to a preferred embodiment, it will be understood by those skilled in the art that various changes in form and detail may be made therein without departing from the spirit and scope of the invention.

What is claimed is:

1. A delay correction system for a voltage channel in a sampled data measurement system, comprising:

a decimating filter for decimating a received signal;

a coarse delay component coupled to follow the decimating filter wherein the coarse delay component provides a coarse delay correction for the received signal;

a data rate reducing component coupled to follow the coarse delay component wherein the data rate reducing component further reduces a rate of the received signal; and a fine delay component coupled to follow the data rate reducing component wherein the fine delay correcting component provides a fine delay correction which is preceded by both the decimating filter and the data rate reducing component.

2. The delay correction system according to claim 1 further comprising:

a controller coupled to the coarse delay component for variably adjusting a value for the coarse delay correction.

3. The delay correction system according to claim 1 further comprising:

a controller coupled to the fine delay component for variably adjusting a value.

4. The delay correction system according to claim 1 wherein the coarse delay component is a register delay element.

5. The delay correction system according to claim 1 wherein the fine delay component is a register delay element.

6. The delay correction system according to claim 1 wherein the decimating filter decimates by a factor of sixty-four (64).

7. The delay correction system according to claim 1 wherein the data rate reducing component decimates by a factor of two (2).

8. A method for correcting a delay of a voltage in a voltage channel for a sampled data measurement system, comprising:

decimating, by a decimating filter, a received signal;

generating, by a coarse delay component that is coupled to and follows the decimating filter, a coarse delay correction for the received signal;

reducing, by a data rate reducing component that is coupled to and follows the coarse delay component, a rate of the received signal; and generating, by a fine delay component that is coupled to and follows the data rate reducing component, a fine delay correction which is preceded by both the decimating filter and the data rate reducing component.

9. The method according to claim 8 further comprising:

variably adjusting, by a controller coupled to the coarse delay component, a value for the coarse delay correction.

10. The method according to claim 8 further comprising:

variably adjusting, by a controller coupled to the fine delay component, a value for the fine delay correction.

11. The method according to claim 8 wherein the coarse delay component is a register delay element.

12. The method according to claim 8 wherein the fine delay component is a register delay element.

13. The method according to claim 8 wherein the decimating step further comprises:

decimating, by the decimating filter, the received signal by a factor of sixty-four (64).

14. The method according to claim 8 wherein the reducing step further comprises:

decimating, by the data rate reducing component, the received signal by a factor of two (2).

15. A voltage channel for providing a corrected voltage for a sampled data measurement system, comprising:

a decimating filter coupled to follow the analog-to-digital converter wherein the decimating filter decimates the received signal;

a coarse delay component coupled to follow the decimating filter wherein the coarse delay component provides a coarse delay correction for the received signal;

a data rate reducing component coupled to follow the coarse delay component wherein the data rate reducing component further reduces a rate of the received signal; and a fine delay component coupled to follow the data rate reducing component wherein the fine delay correcting component provides a fine delay correction which is preceded by both the decimating filter and the data rate reducing component.

16. The voltage channel according to claim 15 further comprising:

a controller coupled to the coarse delay component for variably adjusting a value for the coarse delay correction.

17. The voltage channel according to claim 15 further comprising:

a controller coupled to the fine delay component for variably adjusting a value for the fine delay correction.

18. The voltage channel according to claim 15 wherein the coarse delay component is a register delay element.

19. The voltage channel according to claim 15 wherein the fine delay component is a register delay element.

20. The voltage channel according to claim 15 wherein the decimating filter decimates by a factor of sixty-four (64).

21. The voltage channel according to claim 15 wherein the data rate reducing component decimates by a factor of two (2).

22. A method for providing a corrected voltage for a voltage channel in a sampled data measurement system, comprising:

converting, by an analog-to-digital converter, a received signal from an analog signal to a digital signal;

decimating, by a decimating filter that is coupled to and follows the analog-to-digital converter, the received signal;

generating, by a coarse delay component that is coupled to and follows the decimating filter, a coarse delay correction for the received signal;

reducing, by a data rate reducing component that is coupled to and follows the coarse delay component, a rate of the received signal; and generating, by a fine delay component that is coupled to and follows the data rate reducing component, a fine delay correction which is preceded by both the decimating filter and the data rate reducing component.

23. The method according to claim 22 further comprising:

variably adjusting, by a controller coupled to the coarse delay component, a value for the coarse delay correction.

24. The method according to claim 22 further comprising:

variably adjusting, by a controller coupled to the fine delay component, a value for the fine delay correction.

25. The method according to claim 22 wherein the coarse delay component is a register delay element.

26. The method according to claim 22 wherein the fine delay component is a register delay element.

27. The method according to claim 22 wherein the decimating step further comprises:

decimating, by the decimating filter, the received signal by a factor of sixty-four (64).

28. The method according to claim 22 wherein the reducing step further comprises:

decimating, by the data rate reducing component, the received signal by a factor of two (2).

29. A sampled data measurement system for sampling data of a received signal, comprising:

a voltage channel for providing a corrected voltage having:

an analog-to-digital converter for converting a received signal from an analog voltage signal to a digital voltage signal;

a decimating filter coupled to follow the analog-to-digital converter wherein the decimating filter decimates the digital voltage signal;

a coarse delay component coupled to follow the decimating filter wherein the coarse delay component provides a coarse delay correction for the digital voltage signal;

a data rate reducing component coupled to follow the coarse delay component wherein the data rate reducing component further reduces a rate of the digital voltage signal; and a fine delay component coupled to follow the data rate reducing component wherein the fine delay correcting component provides a fine delay correction which is preceded by both the decimating filter and the data rate reducing component;

a current channel for providing a current having:

another analog-to digital converter for converting the received signal from an analog current signal to a digital current signal;

another decimating filter coupled to follow the another analog-to-digital converter wherein the another decimating filter decimates the digital current signal; and another data rate reducing component coupled to follow the another decimating filter wherein the another data rate reducing component further reduces a rate of the digital current signal;

a multiplier having inputs that receive outputs of both the voltage channel and the current channels and that further generates a multiplier output; and a summation circuit coupled to the multiplier which receives as an input the multiplier output and generates a sampled data output.

30. The system according to claim 29 further comprising:

a controller coupled to the coarse delay component for variably adjusting a value for the coarse delay correction.

31. The system according to claim 29 further comprising:

a controller coupled to the fine delay component for variably adjusting a value for the fine delay correction.

32. The system according to claim 29 wherein the coarse delay component is a register delay element.

33. The system according to claim 29 wherein the fine delay component is a register delay element.

34. The system according to claim 29 wherein the decimating filter decimates by a factor of sixty-four (64).

35. The system according to claim 29 wherein the data rate reducing component decimates by a factor of two (2).

36. A method for sampling data of a received signal by a sampled data measurement system, comprising:

generating, by a voltage channel, a corrected voltage for a received signal wherein the generating step by the voltage channel further comprises:

converting, by an analog-to-digital converter, a received signal from an analog voltage signal to a digital voltage signal;

decimating, by a decimating filter that is coupled to and follows the analog-to-digital converter, the digital voltage signal;

generating, by a coarse delay component that is coupled to and follows the decimating filter, a coarse delay correction for the digital voltage signal;

reducing, by a data rate reducing component that is coupled to and follows the coarse delay component, a rate of the digital voltage signal; and generating, by a fine delay component that is coupled to and follows the data rate reducing component, a fine delay correction which is preceded by both the decimating filter and the data rate reducing component;

generating, by a current channel, a current for the received signal wherein the generating step by the current channel further comprises:

converting, by another analog-to digital converter, the received signal from an analog current signal to a digital current signal;

decimating, by another decimating filter that is coupled to and follows the another analog-to-digital converter, the digital current signal; and reducing, by another data rate reducing component that is coupled to and follows the another decimating filter, a rate of the digital current signal;

receiving and multiplying, by a multiplier, outputs of both the voltage channel and the current channels to generate a multiplier output; and generating, by a summation circuit coupled to the multiplier which receives as an input the multiplier output, a sampled data output.

37. The method according to claim 36 further comprising:

variably adjusting, by a controller coupled to the coarse delay component, a value for the coarse delay correction.

38. The method according to claim 36 further comprising:

variably adjusting, by a controller coupled to the fine delay component, a value for the fine delay correction.

39. The method according to claim 36 wherein the coarse delay component is a register delay element.

40. The method according to claim 36 wherein the fine delay component is a register delay element.

41. The method according to claim 36 wherein the first decimating step further comprises:

decimating, by the decimating filter, the received signal by a factor of sixty-four (64).

42. The method according to claim 36 wherein the first reducing step further comprises:

decimating, by the data rate reducing component, the received signal by a factor of two (2).

43. A digital filter system for filtering and sampling data of a received signal, comprising:

a voltage channel for providing a corrected voltage having:

an analog-to-digital converter for converting a received signal from an analog voltage signal to a digital voltage signal;

a decimating filter coupled to follow the analog-to-digital converter wherein the decimating filter decimates the digital voltage signal;

a coarse delay component coupled to follow the decimating filter wherein the coarse delay component provides a coarse delay correction for the digital voltage signal;

a data rate reducing component coupled to follow the coarse delay component wherein the data rate reducing component further reduces a rate of the digital voltage signal; and a fine delay component coupled to follow the data rate reducing component wherein the fine delay correcting component provides a fine delay correction which is preceded by both the decimating filter and the data rate reducing component;

a current channel for providing a current having:

another analog-to digital converter for converting the received signal from an analog current signal to a digital current signal;

another decimating filter coupled to follow the another analog-to-digital converter wherein the another decimating filter decimates the digital current signal; and another data rate reducing component coupled to follow the another decimating filter wherein the another data rate reducing component further reduces a rate of the digital current signal;

a multiplier having inputs that receive outputs of both the voltage channel and the current channels and that further generates a multiplier output; and a summation circuit coupled to the multiplier which receives as an input the multiplier output and generates a sampled data output.

44. The system according to claim 43 further comprising:

a controller coupled to the coarse delay component for variably adjusting a value for the coarse delay correction.

45. The system according to claim 43 further comprising:

a controller coupled to the fine delay component for variably adjusting a value for the fine delay correction.

46. The system according to claim 43 wherein the coarse delay component is a register delay element.

47. The system according to claim 43 wherein the fine delay component is a register delay element.

48. The system according to claim 43 wherein the decimating filter decimates by a factor of sixty-four (64).

49. The system according to claim 43 wherein the data rate reducing component decimates by a factor of two (2).

50. A method for digitally filtering and sampling data of a received signal, comprising:

generating, by a voltage channel, a corrected voltage for a received signal wherein the generating step by the voltage channel further comprises:

converting, by an analog-to-digital converter, a received signal from an analog voltage signal to a digital voltage signal;

decimating, by a decimating filter that is coupled to and follows the analog-to-digital converter, the digital voltage signal;

generating, by a coarse delay component that is coupled to and follows the decimating filter, a coarse delay correction for the digital voltage signal;

reducing, by a data rate reducing component that is coupled to and follows the coarse delay component, a rate of the digital voltage signal; and generating, by a fine delay component that is coupled to and follows the data rate reducing component, a fine delay correction which is preceded by both the decimating filter and the data rate reducing component;

generating, by a current channel, a current for the received signal wherein the generating step by the current channel further comprises:

converting, by another analog-to digital converter, the received signal from an analog current signal to a digital current signal;

decimating, by another decimating filter that is coupled to and follows the another analog-to-digital converter, the digital current signal; and reducing, by another data rate reducing component that is coupled to and follows the another decimating filter, a rate of the digital current signal;

receiving and multiplying, by a multiplier, outputs of both the voltage channel and the current channels to generate a multiplier output; and generating, by a summation circuit coupled to the multiplier which receives as an input the multiplier output, a sampled data output.

51. The method according to claim 50 further comprising:

variably adjusting, by a controller coupled to the coarse delay component, a value for the coarse delay correction.

52. The method according to claim 50 further comprising:

variably adjusting, by a controller coupled to the fine delay component, a value for the fine delay correction.

53. The method according to claim 50 wherein the coarse delay component is a register delay element.

54. The method according to claim 50 wherein the fine delay component is a register delay element.

55. The method according to claim 50 wherein the first decimating step further comprises:

decimating, by the decimating filter, the received signal by a factor of sixty-four (64).

56. The method according to claim 50 wherein the first reducing step further comprises:

decimating, by the data rate reducing component, the received signal by a factor of two (2).

* * * * *